United States Patent [19]
Stoerk et al.

[11] Patent Number: 5,219,443
[45] Date of Patent: Jun. 15, 1993

[54] CABINET FOR ACCEPTING ELECTRONIC ASSEMBLIES

[75] Inventors: Peter Stoerk, Eurasburg; Heinz-Juergen Niggl, Poecking; Georg Buchberger, Munich; Karl Zell, Niederpoecking, all of Fed. Rep. of Germany

[73] Assignee: Siemens Aktiengesellschaft, Munich, Fed. Rep. of Germany

[21] Appl. No.: 585,968

[22] Filed: Sep. 21, 1990

[30] Foreign Application Priority Data
Sep. 28, 1989 [DE] Fed. Rep. of Germany ....... 3932488

[51] Int. Cl.⁵ .......................................... A47B 81/00
[52] U.S. Cl. ................................................ 312/223.6
[58] Field of Search .................. 312/223, 194; 211/41, 211/26

[56] References Cited

U.S. PATENT DOCUMENTS

| | | | |
|---|---|---|---|
| 3,905,483 | 9/1975 | Patrick | 211/26 X |
| 4,681,378 | 7/1987 | Hellman | 312/223 X |
| 5,016,947 | 5/1991 | Hsu et al. | 312/223 |

*Primary Examiner*—Peter R. Brown
*Attorney, Agent, or Firm*—Hill, Steadman & Simpson

[57] ABSTRACT

An equipment cabinet having side walls, floor and ceiling formed of sheet metal blanks whose middle region is perforated and whose edge region comprises parallel slots proceeding perpendicular to the edges, whereby the edge regions are multiply angled off, or folded over, for the formation of string pieces. The side walls are joined to the floor and ceiling with connector elements having a quadratic cross-section.

26 Claims, 2 Drawing Sheets

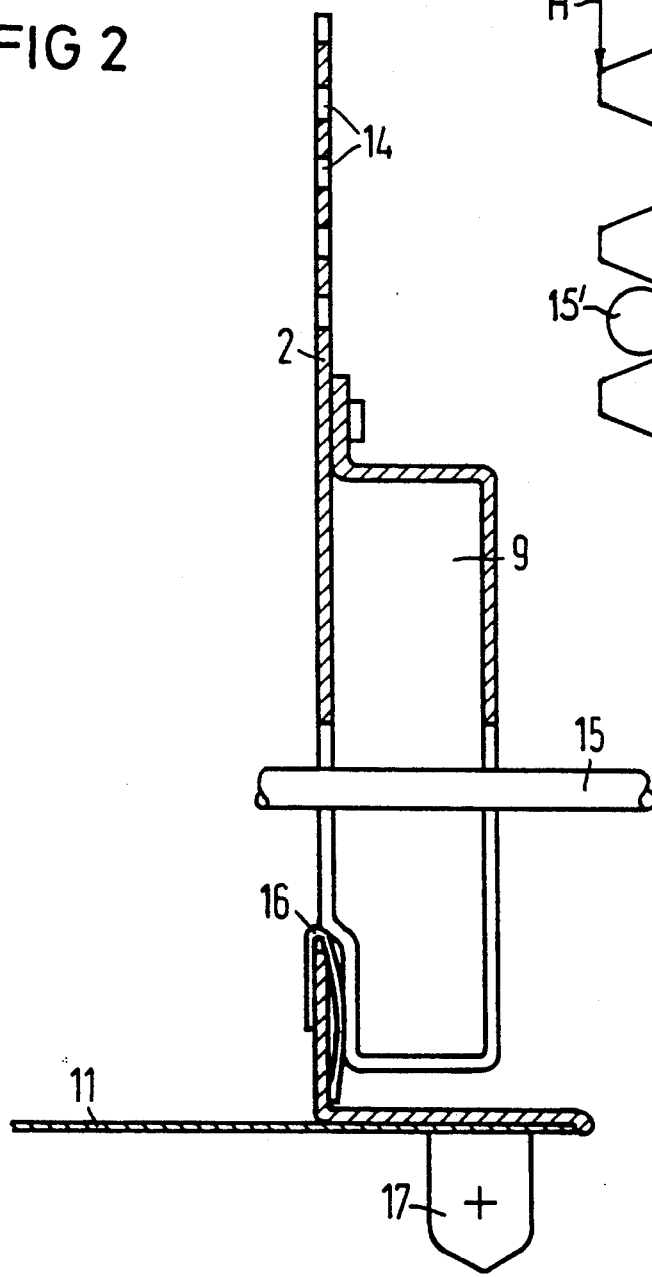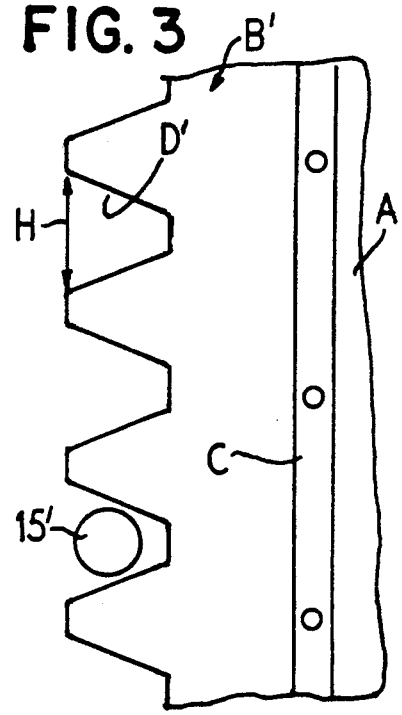

CABINET FOR ACCEPTING ELECTRONIC ASSEMBLIES

BACKGROUND OF THE INVENTION

The present invention relates to an equipment cabinet for the acceptance of electronic assemblies. Previous metal cabinets for accepting electronic assemblies are usually characterized by an involved structure that leads to heavy and bulky cabinets. The individual cabinets were usually composed of a frame to which side walls, a floor, ceiling parts, a back wall and a door had to be secured in an involved way. Particular difficulties arose when a one hundred percent shielding of the cabinet was to be achieved.

A further disadvantage of the previous cabinets is their height, weight and their complicated assembly. Added thereto as an additional disadvantage is that the cabinets had prescribed sizes and the customer had to decide in favor of a specific size category when ordering.

SUMMARY OF THE INVENTION

It is an object of the present invention to specify an equipment cabinet that is distinguished by a simple structure as well as a low weight, and that can be expandable in a simple way.

This object is inventively achieved by a metal cabinet for the acceptance of electronic components wherein side walls, floor and ceiling are shaped of planar blanks, such as sheet metal blanks, whose middle region is perforated and whose edge regions comprise parallel slots proceeding perpendicular to the edges, whereby the edge regions are multiply bent off, or folded over, to form front and back stiffening ribs or string pieces, the free edges of the sheet metal blanks can then be each respectively firmly joined to the middle region to complete each string piece. The side walls with floor and ceiling are joined with connecting elements having a quadratic cross-section. Perforated plates provided with shielding contacts can be plugged on as front wall and back wall.

Although sheet metal is an exemplary material choice for the cabinet, other materials of construction are encompassed by the invention.

The cabinet of the invention is distinguished by a simple structure. It requires no frame rack to which the side parts must be secured in a complicated way. A further advantage of the cabinet of the invention is that it is inexpensive to manufacture.

An advantageous development of the equipment cabinet of the invention is characterized in that the front and back walls as well as the side walls have prescribed heights or standardized incremental heights, whereby vertically adjacent side walls, front wall segments and back wall segments can be connected to one another via the connecting elements to form the side walls, front walls and back walls respectively. An existing cabinet can be simply expanded in height in this way without extensive remodeling.

Another advantageous development of the invention is that the front walls are joined with hinges to a front, lateral string piece, so that the front walls can be moved like a normal cabinet door. A further development of the invention is that the slots proceeding in the edge regions of the sheet metal blanks, are expanded in a middle portion of the slot. Slots for the passage of the incoming as well as outgoing cables are created in this way at the front and back edges of the cabinet. It can also be advantageous under certain circumstances to fashion the front wall of a smooth sheet metal part without perforations.

Another expedient development of the equipment cabinet of the invention is comprised therein that design parts, such as cover panels or trim, can be plugged or easily removably fastened to the side walls and to the ceiling.

The invention shall be set forth in greater detail below with reference to an exemplary embodiment shown in the drawing.

BRIEF DESCRIPTION OF THE DRAWINGS

FIG. 2 is a section through a vertical string piece of the metal cabinet of the invention.

FIG. 3 is an enlarged partial side view of an alternate feature of the slots shown in FIG. 1.

DETAILED DESCRIPTION OF THE PREFERRED EMBODIMENT

Figure 1:
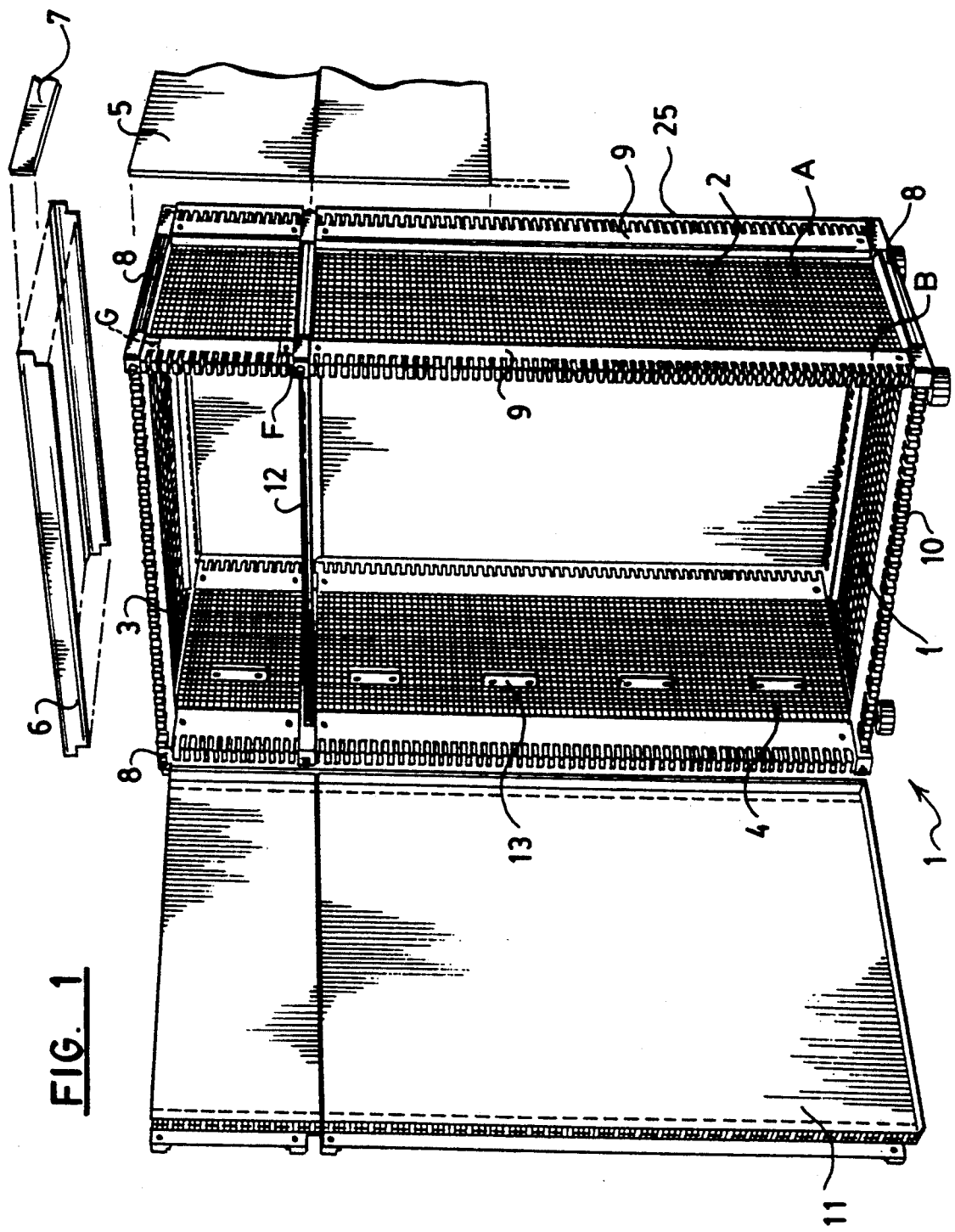
FIG. 1 is a perspective, partial view of a metal cabinet of the present invention.

The invention relates to an equipment cabinet 1. Important components of the metal cabinet of the invention shown in FIG. 1 are side walls 2, 4 as well as a floor 1 and a ceiling 3. The side walls 2, 4, the floor 1, and the ceiling 3 can be shaped of planar or sheet metal blanks having a perforated middle region A and lateral edge regions B comprising parallel slots D proceeding perpendicular to the edges. The edge regions B are thereby multiply angled off, or folded over, such, as may be seen in FIG. 2, that free edges C of the sheet metal blanks are each respectively firmly joined to the middle region A. In this way, the edge regions B of the sheet metal blanks form stiffening ribs or supporting string pieces 9 of the equipment cabinet 1 that lend the cabinet the necessary stability and rigidity. Although joining the free edges C to the middle region A is an exemplary embodiment, sufficient stiffness may be achieved without actually joining; the stiffness derived from the folded structure of the string pieces; and such a configuration is also encompassed by the invention.

Side walls, floor and ceiling are connected to one another with connector elements 8 that each have a quadratic or rectangular cross-section. The connector elements 8 can be provided with protruding tabs or lugs having screw holes G which insert into adjacent string pieces 9 where a screw F is inserted through the string piece 9 and into the lug residing therein. Thus, depending on the orientation of adjacent panels such as side walls, floor or ceiling to be connected, the connector element 8 has protruding tabs G insertable into string pieces of the respective panels to be connected. As an alternative to these tabs, formed lugs can be utilized which fit tightly within the rectangular cross-section of the string pieces. The formed lugs can comprise a similar shape as the rectangular cross-section to tightly telescope into the rectangular cross-section of the string piece. A screw connection of the formed lug to the string piece can then be made.

A simple design of the equipment cabinet derives in this way. The holes of the sheet metal blanks are used as fastening holes 14 for fastening elements 13 to which assemblies (not shown) can be secured.

As a result of the slots arranged above one another in the string pieces, a passage of incoming and outgoing cables given a closed cabinet is possible in all edge regions at the sides as well as at the top and bottom. When folded, the slots provide open areas on opposite lateral sides of the edge regions to permit through passage of a cable 15. The front walls 11 can be fashioned as a hingable door with hinges 17 or can be fastened as a pluggable or removably fastenable metal panel that seals the front part of the metal cabinet RF-tight with shielding contacts 16.

A back wall 25 is shown smooth in FIG. 1; the back wall 25, however, can be composed of perforated sheet metal since good heat elimination derives as a result thereof.

A further advantage of the cabinet of the invention derives from the employment of side walls, front walls, and back walls of equal lengths as a group, with selectable groups having different select or standard lengths. As may be seen from FIG. 1, a selected height expansion of the equipment cabinet is possible at any time in this way.

For vertically expanded cabinets, or for wherever increased lateral stability is desired, a cross member 12 can be utilized to provide lateral stability to the equipment cabinet. The cross member 12 can be a bar or sheet metal component which can be fixed to opposite connector elements 8, spanning opposite side walls 2, 4.

If it is desirable, then the side walls as well as the ceiling of the equipment cabinet of the invention can be clad with design parts, such as side panels 5, or trim pieces 6, 7 whereby the respective height of the design parts employed for the sides corresponds to the height of the side walls employed.

FIG. 3 shows a further exemplary embodiment of an edge region B' using expanded slots B' to provide an increased clearance H for passing a cable 15' through said edge region B'. By expanding a middle portion of the expanded slot D' as compared to the slot D previously described, the increased clearance H is derived for each expanded slot D' on an outer edge of the edge region B'.

Although the present invention has been described with reference to a specific embodiment, those of skill in the art will recognize that changes may be made thereto without departing from the scope and spirit of the invention as set forth in the appended claims.

We claim:

1. An equipment cabinet for accepting electronic assemblies comprising:
a floor structure;
a ceiling structure;
at least one side wall connecting said floor structure and said ceiling structure, said side wall comprising a planar middle region and at least one edge region, said edge region arranged vertically, adjacent a lateral edge of said side wall, said edge region comprising a closed hollow polygonal cross-section with an inside wall portion and an outside wall portion, said edge region comprising a plurality of parallel slots aligned along a length of said edge region in a vertical column, each of said slots extending through a partial perimeter of said cross-section notching both of said inside wall portion and said outside wall portion forming multiple cable pathways through said side wall while the unnotched portion of the edge region retains a solid portion of said inside wall portion and said outside wall portion continuously along said length.

2. An equipment cabinet according to claim 1, wherein said at least one side wall comprises two side walls arranged laterally opposite in a spaced apart posture, and said at least one edge region comprises two edge regions per each said wall, arranged vertically along lateral edges of said side walls.

3. An equipment cabinet according to claim 2, wherein said cabinet further comprises a front wall, said front wall hingedly connected to one said edge region of one said side wall, said one edge region being arranged at a front side of said one side wall.

4. An equipment cabinet according to claim 3, wherein said front wall is a smooth panel without perforations.

5. An equipment cabinet according to claim 2, wherein said cabinet further comprises design parts, said design parts plugged onto said side walls abutting and spanning said two edge regions per each side wall, said design parts held spaced from said planar middle region by said edge regions, covering said planar middle region.

6. An equipment cabinet according to claim 2, wherein said cabinet further comprises a front wall and a plurality of shielding contacts, said front wall pluggably installed in position between and against said side walls with said shielding contacts sealing said cabinet RF-tight.

7. An equipment cabinet according to claim 6, wherein said front wall further comprises a perimeter frame holding hingedly a door therein, said perimeter frame holding said shielding contacts, said perimeter frame pluggable into position between and against said side walls.

8. A cabinet according to claim 1, wherein said slots have a tapered dimension proceeding inwardly from said lateral edge providing an expanded outward dimension, allowing increased clearance for passing a cable therethrough.

9. An equipment cabinet according to claim 1, wherein said side wall is formed from a planar blank having a free edge, wherein said edge region is formed by a folding over of said free edge of said planar blank by multiply angling off said planar blank to form a closed hollow rectangular cross-section, said free edge thereupon attached to said middle region, closed slots formed in said planar blank have an elongated dimension axially arranged perpendicularly to said free edge of said planar blank, thereby being folded over with said planar blank.

10. An equipment cabinet according to claim 9, wherein said slots have an expanded height dimension in a middle region of said elongated dimension of said slots.

11. An equipment cabinet for accepting electronic assemblies comprising:
a floor structure;
a ceiling structure;
two side walls arranged laterally opposite in a spaced apart posture connecting said floor structure and said ceiling structure, each said side wall comprising a planar middle region and two edge regions, said edge regions arranged vertically, along lateral edges of said side wall, each said edge region comprising a closed hollow polygonal cross-section with an inside wall portion and an outside wall portion, each said edge region comprising a plurality of parallel slots aligned in a vertical column, each of said slots extending through a partial perimeter of said cross-section partially opening said inside wall portion and said outside wall portion forming cable pathways through said side wall;

wherein said ceiling structure and said floor structure each comprise:
a second middle region and at least one second edge region, each said second edge region arranged horizontally, one second edge region adjacent a lateral edge of said respective ceiling structure and another one second edge region adjacent a lateral edge of said floor structure, said second edge regions comprising a closed hollow polygonal cross-section, said second edge regions comprising a plurality of parallel second slots aligned in a horizontal row, forming cable pathways through said ceiling structure and said floor structure.

12. An equipment cabinet according to claim 11, wherein said equipment cabinet further comprises a plurality of connector elements having an elongated structure with a quadratic cross-section, and said side walls are connected to said floor structure and to said ceiling structure by said connector elements along a depth of said side walls.

13. An equipment cabinet according to claim 12, wherein said side walls comprise side wall sections aligned and stacked vertically, said side wall sections connected to one another via said connector elements.

14. An equipment cabinet for accepting electronic assemblies comprising:
a floor structure;
a ceiling structure;
at least one side wall connecting said floor structure and said ceiling structure, said side wall comprising a planar middle region and at least one edge region, said edge region arranged vertically, adjacent a lateral edge of said side wall, said edge region comprising a closed hollow polygonal cross-section with an inside wall portion and an outside wall portion, said edge region comprising a plurality of parallel slots aligned in a vertical column, said slots extending through a partial perimeter of said cross-section notching both of said inside wall portion and said outside wall portion forming multiple cable pathways through said side wall while the unnotched portion of the edge region retains a solid portion of said inside wall portion and said outside wall portion continuously along said length;

wherein the electronic assemblies comprise fastening means, and wherein said planar middle region has thereon a plurality of perforations in a pattern extending vertically and laterally, some of said perforations accepting the fastening means of the electronic assemblies for mounting the electronic assemblies within said cabinet.

15. An equipment cabinet for accepting electronic assemblies comprising:
a floor structure;
a ceiling structure;
two side walls connecting said floor structure and said ceiling structure, arranged in parallel spaced apart fashion, forming a rectangle with said floor structure and said ceiling structure, each said side wall comprising a planar middle region and at least one edge region, said edge region arranged vertically, adjacent a lateral edge of said side wall, said edge region comprising a folded cross-section, said edge region comprising a plurality of slots arranged vertically stacked, said slots extending through a partial perimeter of said cross-section, forming cable pathways penetrating through said sidewalls while said edge region retains a solid folded over portion interior of said slots, said solid folded over portion continuous along a length of said edge region, forming a column.

16. An equipment cabinet according to claim 15, wherein said at least one edge region comprises two edge regions, each arranged adjacent opposite lateral edges of each said side wall.

17. An equipment cabinet according to claim 16, wherein said planar middle region and said edge regions are formed of a planar blank having lateral free edges, said planar blank folded over onto itself in said edge regions to form a closed hollow cross-section, said free edges of said blank connected to said middle region to complete said closed hollow cross-section, said slots arranged planarly with said blank, folded over with said blank, wherein each said slot has an open area on opposite sides of said edge region.

18. An equipment cabinet for accepting electronic assemblies comprising:
a floor structure;
a ceiling structure;
two side walls connecting said floor structure and said ceiling structure, arranged in parallel spaced apart fashion, forming a rectangle with said floor structure and said ceiling structure, each said side wall comprising a planar middle region and two edge regions, each said edge region arranged vertically, adjacent opposite lateral edges of said side wall, each said edge region comprising a folded cross-section, each said edge region comprising a plurality of slots arranged vertically stacked, said slots extending about a partial perimeter of said cross-section, forming cable pathways through said sidewalls;

wherein said floor structure and said ceiling structure each comprise a second planar middle region and a second edge region, said second edge region arranged horizontally, adjacent a lateral edge of each of said floor structure and said ceiling structure, said second edge region comprising a closed hollow cross-section, said second edge region comprising a plurality of slots arranged in a horizontal row, said slots extending around a portion of a perimeter of said closed hollow cross-section, forming cable pathways through each of said floor structure and said ceiling structure.

19. An equipment cabinet according to claim 18, wherein said equipment cabinet further comprises connector elements comprising an elongate structural member with a rectangular cross-section, said connector elements providing screw lugs protruding therefrom, said connector elements arranged between said side walls and said ceiling structure, and between said sidewalls and said floor structure, said screw lugs of said connector elements inserted into an adjacent edge region of said side walls, said floor structure, and said ceiling structure to be connected and fastened thereto, said connector element extending along a depth of said side walls.

20. An equipment cabinet according to claim 19, wherein said side walls each comprise a bottom side wall segment and a top side walls segment, said bottom side wall segment and said top side wall segment vertically stacked and aligned and connected together with one of said connector elements.

21. An equipment cabinet according to claim 20, wherein said equipment cabinet further comprises a back wall and a front wall, said back wall comprising a bottom back wall segment and a top back wall segment vertically stacked and aligned and connected together, and said front wall comprises a bottom front wall segment and a top front wall segment vertically stacked and aligned and connected together, said back wall mounted to a backside of said side walls, and said front wall mounted to a front side of said side walls, forming an enclosed cabinet, said top side wall segments, said top back wall segment and said top front wall segment having equivalent heights.

22. An equipment cabinet according to claim 21, further comprising a top cover panel and a bottom cover panel, said top cover panel and said bottom cover panel attachable to an outside surface of said top side wall segment and said bottom side wall segment respectively, said top cover panel having a height equivalent to a height of said top side walls segment.

23. An equipment cabinet for accepting electronic assemblies comprising:
a floor structure;
a ceiling structure;
at least one side wall connecting said floor structure and said ceiling structure, said side wall comprising a planar blank folded over to create a planar middle region and two lateral edge regions, said edge regions arranged vertically, each edge region adjacent a lateral edge of said side wall respectively, each said edge region comprising a closed hollow geometric cross-section, and said planar middle region providing a plurality of perforations therethrough, arranged in a pattern extending vertically and laterally substantially from said floor structure to said ceiling structure and between edge regions, said perforations for accepting fastening means for mounting electronic assemblies within said cabinet; and
wherein said closed hollow geometric cross-section forms contiguously an inside wall portion, an end wall portion and an outside wall portion, and said edge region provides a plurality of parallel slots aligned in a vertical column, each said slot completely opening said end wall and partially opening said inside and outside walls, notching both of said inside wall portion and said outside wall portion, forming multiple cable pathways through the side wall while the unnotched portion of the edge region retains a solid portion of said inside wall portion and said outside wall portion continuously along a length of said edge region.

24. An equipment cabinet according to claim 23, wherein said at least one side wall comprises two side walls arranged laterally opposite in the spaced apart posture.

25. An equipment cabinet according to claim 24, wherein said floor structure and said ceiling structure are fashioned identically as said side walls, varying only in length.

26. An equipment cabinet according to claim 24, wherein said cabinet further comprises design panels, said design panels plugged onto said side walls abutting and spanning said two edge regions per each side wall, said design panels held spaced from said planar middle region by said edge regions, providing a smooth outer surface to said cabinet.

* * * * *